(12) United States Patent
Gröger

(10) Patent No.: US 11,429,091 B2
(45) Date of Patent: Aug. 30, 2022

(54) METHOD OF MANUFACTURING A SEMICONDUCTOR DEVICE AND PROCESS CONTROL SYSTEM FOR A SEMICONDUCTOR MANUFACTURING ASSEMBLY

(71) Applicant: KLA CORPORATION, Milpitas, CA (US)

(72) Inventor: Philip Gröger, Dresden (DE)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 17/180,346

(22) Filed: Feb. 19, 2021

(65) Prior Publication Data
US 2022/0137607 A1 May 5, 2022

Related U.S. Application Data

(60) Provisional application No. 63/106,901, filed on Oct. 29, 2020.

(51) Int. Cl.
*G05B 19/418* (2006.01)
(52) U.S. Cl.
CPC .............. *G05B 19/41885* (2013.01); *G05B 2219/45031* (2013.01)
(58) Field of Classification Search
CPC .............. G05B 19/41885; G05B 2219/45031
See application file for complete search history.

(56) References Cited

U.S. PATENT DOCUMENTS

| | | | |
|---|---|---|---|
| 6,442,496 | B1 | 8/2002 | Pasadyn et al. |
| 7,565,254 | B2 | 7/2009 | Good et al. |
| 8,017,411 | B2 | 9/2011 | Sonderman et al. |
| 8,175,831 | B2 | 5/2012 | Izikson et al. |
| 8,983,014 | B2 | 3/2015 | Shibasaki |
| 9,606,453 | B2 | 3/2017 | Izikson et al. |
| 9,646,896 | B2 | 5/2017 | Hsieh et al. |

(Continued)

FOREIGN PATENT DOCUMENTS

| | | |
|---|---|---|
| CN | 110648935 A | 1/2020 |
| WO | 2002023289 A2 | 3/2002 |

OTHER PUBLICATIONS

WIPO, ISR for International Application No. PCT/US2021/023553, Jul. 26, 2021.

(Continued)

*Primary Examiner* — Ronald D Hartman, Jr.
(74) *Attorney, Agent, or Firm* — Hodgson Russ LLP

(57) ABSTRACT

A method of manufacturing a semiconductor device includes defining a sampling plan in a process control system. Measurement values are obtained at the first number N of the sample points. The first number of measurement values are modelled using a wafer model to generate a first set of coefficients according to a reference model. A second number M of the first number N of sample points is randomly selected. The second number M of measurement values obtained at the second number M of sample points is modelled using the wafer model to generate a second set of coefficients according to a phase_1 model. One of the M sample points is randomly replaced by one of the N–M sample points to obtain a subsample. The measurement values of the subsample are modelled using the wafer model to generate a third set of coefficients according to a phase_2 model.

19 Claims, 5 Drawing Sheets

(56) References Cited

U.S. PATENT DOCUMENTS

| | | | |
|---|---|---|---|
| 10,190,991 B2 | 1/2019 | Sofer et al. | |
| 10,234,401 B2 | 3/2019 | Buhl et al. | |
| 10,269,660 B2 | 4/2019 | Cheng et al. | |
| 10,754,260 B2 | 8/2020 | Demirer et al. | |
| 10,983,073 B2* | 4/2021 | Ogata | G01N 23/20016 |
| 2004/0032582 A1 | 2/2004 | Johnson | |
| 2004/0176928 A1 | 9/2004 | Johnson | |
| 2007/0258074 A1 | 11/2007 | Moest | |
| 2008/0167830 A1 | 7/2008 | Behm et al. | |
| 2008/0201117 A1 | 8/2008 | Wong et al. | |
| 2011/0202298 A1 | 8/2011 | Izikson et al. | |
| 2012/0084041 A1* | 4/2012 | Izikson | G03F 7/70616 |
| | | | 702/113 |
| 2014/0354969 A1 | 12/2014 | Elings et al. | |
| 2015/0276618 A1* | 10/2015 | Plihal | G01N 21/8851 |
| | | | 702/182 |
| 2016/0003891 A1* | 1/2016 | Rajaduray | G01R 31/2648 |
| | | | 702/65 |
| 2017/0242425 A1 | 8/2017 | Buhl et al. | |
| 2018/0240225 A1* | 8/2018 | Harada | G06T 7/001 |

OTHER PUBLICATIONS

Lee et al., "In-depth analysis of sampling optimization methods", Proc. SPIE 9978, Metrology, Inspection and Process Control for Microlithography XXX, Mar. 8, 2016, p. 97781E, SPIE Advanced Llithography, US.

Park et al., "CD and OCD sampling scheme optimization for HVM environment", Proc. of SPIE 10959, Metrology, Inspection and Process Control for Microlithography XXXIII, Mar. 26, 2019, p. 109592F, SPIE Advanced Lithography, US.

Kurz et al., "A sampling decision system for semiconductor manufacturing—relying on virtual metrology and actual measurements", Proceedings of the 2014 Winter Simulation Conference, Dec. 10, 2014, p. 2469-2660, IEEE Xplore, US.

Susto et al., "A Dynamic Sampling Approach for Cost Reduction in Semiconductor Manufacturing", Procedia Manufacturing, Jun. 11, 2018, vol. 17, p. 1031-1038, Elsevier, US.

* cited by examiner

METHOD OF MANUFACTURING A SEMICONDUCTOR DEVICE AND PROCESS CONTROL SYSTEM FOR A SEMICONDUCTOR MANUFACTURING ASSEMBLY

CROSS-REFERENCE TO RELATED APPLICATIONS

This application claims priority to the provisional patent application filed Oct. 29, 2020 and assigned U.S. App. No. 63/106,901, the disclosure of which is hereby incorporated by reference.

BACKGROUND

The embodiments concern methods of manufacturing semiconductor devices using sampling plans as well as process control in semiconductor wafer processing.

In the course of manufacturing semiconductor elements, metrology tools monitor the results of process steps effective on wafers. Results of wafer metrology may be used for fault detection, for determining abnormal equipment states, for executing tool alarms, for examining the cause of faults and for classifying a process wafer as a faulty wafer or as a wafer in line with target tolerances. Feed forward control uses the results of previous inspections for adjusting process parameters of following processes. Run-to-run control automatically changes process recipe parameters for a given wafer or wafer lot on the basis of feed-back data from post-process metrology applied to a previous run. APC (advanced process control) combines aspects of fault detection, classification, feed forward control and run-to-run control. Metrology sites may include specially designed measurement targets and/or portions of a product pattern.

Wafer metrology aims at an economic trade-off between metrology costs and yield improvement. Typically, wafer metrology uses a sampling plan defining the position of a number of metrology sites or sample points on selected process wafers of a wafer lot and exclusively measures selected process wafers at the metrology sites identified in the sampling plan. The metrology sites may be within exposure fields, outside of the exposure fields, e.g., in a wafer edge area, within chip areas and/or outside of the chip areas, e.g., in kerf areas of a wafer.

There is a need for improving the effectiveness of sampling plans and for increasing the efficiency of the sampling plans.

SUMMARY

A method of manufacturing a semiconductor device comprises defining a sampling plan in a process control system, the sampling plan containing position information about a first number N of sample points on a process wafer, obtaining measurement values at the first number N of the sample points, the measurement values referring to a first physical property of the process wafer measured by a first metrology tool, modelling the first number of measurement values using a wafer model to generate a first set of coefficients according to a reference model, the wafer model being based on a model function describing the physical property as a function of one or more position variable(s), randomly selecting a second number M of the first number N of sample points, wherein M<N, modelling the second number M of measurement values obtained at the second number M of sample points, using the wafer model to generate a second set of coefficients according to a phase_1 model, randomly replacing one of the M sample points by one of the N−M sample points to obtain a subsample, modelling the measurement values of the subsample using the wafer model to generate a third set of coefficients according to a phase_2 model, and using the subsample of sample points for performing further measurements.

A computer program comprises instructions which, when the program is executed by a computer, cause the computer to carry out the method as defined above.

A process control system for a semiconductor manufacturing assembly is configured to define a sampling plan in a process control system, the sampling plan containing position information about a first number N of sample points on a process wafer, obtain measurement values at the first number N of the sample points, the measurement values referring to a first physical property of the process wafer measured by a first metrology tool, model the first number of measurement values using a wafer model to generate a first set of coefficients according to a reference model, the wafer model being based on a model function describing the physical property as a function of one or more position variable(s), randomly select a second number M of the first number N of sample points, wherein M<N, model the second number M of measurement values obtained at the second number M of sample points, using the wafer model to generate a second set of coefficients according to a phase_1 model, randomly replace one of the M sample points by one of the N−M sample points to obtain a subsample, model the measurement values of the subsample using the wafer model to generate a third set of coefficients according to a phase_2 model, and to provide the subsample of sample points as a reduced sampling plan for performing further measurements.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles.

Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "over", "on", "above", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

Figure 1:
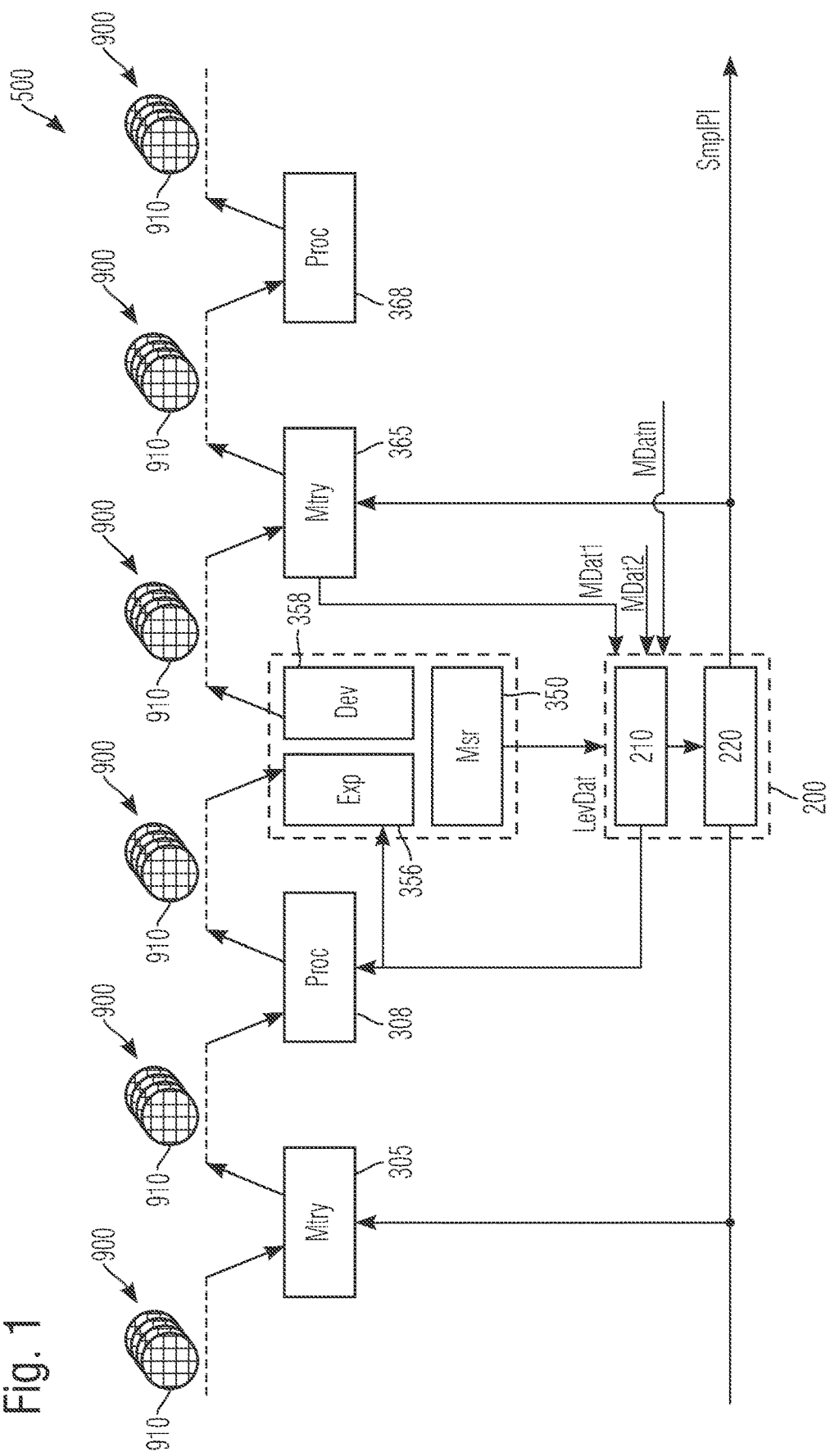
FIG. 1 is a schematic block diagram of a portion of a semiconductor manufacturing assembly according to embodiments.

FIG. 1 shows a schematic representation of a portion of a semiconductor manufacturing assembly 500 for process wafers 910, which are supplied to the semiconductor manufacturing assembly 500 in wafer lots 900, wherein process wafers 910 belonging to the same wafer lot 900 are processed in the same or at least similar way in close temporal relation, e.g., partly contemporaneously and/or directly one after another. The semiconductor manufacturing assembly 500 includes a plurality of process tools 308, 350, 368 for patterning processes, deposition processes, etch processes, implantation processes and heating treatments, by way of example. Metrology tools 305, 365 inspect the process wafers 910 at a number of metrology sites distributed across and among the process wafers 910 of a wafer lot 900 and in accordance with a sampling plan. Between the illustrated process and metrology tools 305, 308, 350, 365, 368 the process wafers 910 may be loaded to further process and metrology tools.

The sampling plan may include wafer identification information for identifying specific process wafers 910 in a wafer lot 900. The sampling plan further includes position information identifying the metrology sites or sample points on the process wafers 910 determined for inspection. The metrology sites may have circular, elliptical or rectangular shape. The size of the metrology sites depends on the measurement method. A diameter or edge length of the metrology sites or sample points may be about 100 µm for scatterometric methods and about 1 µm for measurements using electron microscopy.

The metrology tools 305, 365 inspect the process wafers 910 and obtain physical information about the concerned process wafer 910 at and around the metrology sites identified in the sampling plan. The physical information may contain geometric dimensions such as height, width and/or length of a structure on a surface of the process wafer within the measurement area, e.g., a width of a line or a vertical extension of a step or a trench, a sidewall angle of a protrusion extending from a surface of the process wafer 910, or a sidewall angle of a trench extending into a surface of the process wafer 910. Alternatively or in addition the physical information may contain information about thickness and/or composition of a topmost layer covering the process wafer 910 or about other physical properties or characteristics such as line edge roughness, line width roughness, overlay data, wafer shape, wafer deformation, defect density as well as about results of defect and electrical measurements. For example, measurements that may be performed include CD-SEM measurements (critical dimension using a scanning electron microscope), overlay measurements, CD measurements using scatterometry, measurement of topography, e.g. levelling measurement, measurement of wafer bowing and others.

A metrology tool 305 may inspect the process wafers 910. For example, the metrology tool 305 may inspect the process wafers 910 by determining measurement values according to a sampling plan. Then the process wafers 910 may be subjected to at least one further process in a further process tool 308.

The term "measurement value" as used herein in the context of metrology refers to a physical property of the process wafer. The measurement value may comprise levelling data, e.g., levelling data of the process wafers 910 in a state, in which the process wafer 910 is firmly pressed against a flat support base to obtain a dense height map of the concerned process wafer 910 in a chucked state, wherein the process wafer 910 may be electrostatically-chucked or vacuum-chucked at the support base. In the chucked state a global warping or bowing of the process wafer 910 is at least partly or almost completely smoothed.

Accordingly, a topography of the process wafer 910 may be assessed.

Alternatively or in addition, the measurement values may refer to another physical property, for example height maps obtained from unchucked process wafers 910 and including information about wafer bowing and wafer warping.

According to embodiments the assembly is a lithography assembly 350 and the metrology tool 305 is an optical measurement unit, e.g., a scatterometer or a laser measurement unit integrated in or data-linked with an exposure unit 356 of the lithography assembly 350. The optical measurement unit obtains levelling data from the process wafers 910 and may transmit the levelling data to a controller that controls a projection tool and/or a support stage of the exposure unit 356. The controller may control the projection tool and/or the support stage to locally adapt focal position and/or exposure dose in response to local levelling data. For example, for performing overlay measurements, first overlay marks may be present on the process wafer 910. During the processing, subsequent layers may be formed over the process wafer 910. A photoresist layer may be formed over the process wafer 910 and may be patterned. A further overlay mark may for example be patterned in the photoresist layer. According to further embodiments, layers formed over the process wafer 910 may be patterned, the generated pattern comprising a further overlay mark. By determining a distance, e.g. a shift measured in the x- and y-direction between the first overlay mark on the process wafer 910 and the further overlay mark formed in a layer or pattern over the process wafer 910, the overlay may be assessed. For example, the distance or shift may be determined by optical methods. Generally, overlay measurements comprise measurement between first overlay marks on a process wafer 910 and a corresponding further overlay mark in a subsequently formed pattern over the process wafer 910.

A developer unit 358 of the lithography assembly 350 may further process the process wafers 910. For example, after exposure by the exposure unit 356, the developer unit 358 may subject the process wafer 910 to a developing process for developing the exposed resist and to a rinsing process for selectively removing the exposed portions of the developed resist with respect to the unexposed portions or vice versa.

The semiconductor manufacturing assembly 500 may comprise a process control system 200 that processes the measurement values, e.g., the levelling or overlay or CD data used by an exposure tool. For example, there may be a central process control system 200 assigned to the semiconductor manufacturing assembly 500. The process control system 200 may comprise a sampling model module 210 and a sampling plan module 220. According to further embodiments, every metrology tool 305, 365 may process the obtained measurement values by the respective metrology tool 305, 365.

The specific processing of the measurement values to define a subsample of sample points or metrology sites and to modify a sampling plan will be described later.

Generally, a wafer model is based on a model function describing a quantifiable physical property as a function of one or more position variable(s) in closed form, wherein at least some or all of the coefficients of the model function are variables and wherein the wafer model may contain absolute and/or relative boundary values for some or all of the coefficients. The wafer model may cover a complete wafer, wherein the model function may be rotationally symmetric or point-symmetric with respect to a centre point of the process wafers 910 or may show no sort of rotational symmetry. Alternatively or in addition, the wafer model may cover wafer sections, e.g., single exposure fields or groups of exposure fields.

A specific set of coefficients for one of the model functions of the wafer model defines a wafer model instance. For determining a wafer model instance, the measurement values obtained from a collection of the process wafers 910 may be successively averaged, wherein outliers may be discarded before calculating the local average values.

A wafer model instance may be descriptive for a complete wafer area or for a wafer section, e.g., an exposure field or a group of exposure fields. For example, a wafer model instance may be obtained by fitting selected exposure fields of the same wafer or by fitting corresponding exposure fields of different process wafers 910, wherein corresponding exposure fields have the same position with respect to a wafer notch. The wafer model instance may be continuously updated with values of the pertinent physical property obtained for each new process wafer assigned to the same collection gives a time response of the wafer model instance and of a process linked to the wafer model instance.

A collection of process wafers 910, may be, for example, a set of process wafers 910 subjected to equivalent processing at the same process tool such that a specific wafer model instance contains information on a specific process tool. By comparing the wafer model instances of different collections of process wafers 910 subjected to equivalent processes at different process tools, specific position-dependent process or process tool signatures may be extracted from the wafer model instances. A further embodiment of a collection of process wafers 910 may be the wafers of the same wafer lot such that the temporal variation of a physical characteristic across a wafer lot can be observed.

A trend in a wafer model instance or a process tool signature may be observed and analysed. An assessment of trends in the wafer model instances and/or process tool signatures may result in determining control parameters adapted for at least partly compensating a trend occurring in a specific process or process tool. The control parameters may either be transmitted as feedback signals for the observed processes or process tools and/or for other processes or process tools the process wafers 910 are subjected to or loaded at before being processed at the lithography assembly 350, and/or as feed forward signals for process tools the process wafers 910 reach after leaving the lithography assembly 350.

The coefficients of the wafer model instances may be initialized with values obtained from a first one of the process wafers 910, with target values, or with values obtained from a sample specimen.

After performing the method that will be described in the following with reference to FIGS. 3A to 3C and 4, a further metrology tool 365 may use the reduced sampling plan for the concerned process wafer 910 or for one or more following process wafers 910 of the current wafer lot 900 to obtain process information, e.g., about the resist pattern formed in the lithography assembly 350.

For example, the process tool 308 may be a deposition tool for depositing a layer onto a surface of the process wafer 910, wherein the deposited layer may be patterned by using a resist deposited, exposed and developed in the lithography assembly 350. Metrology data from the metrology tool 365 and from further metrology tools may also be used for performing the method described. The metrology data may be transmitted through suitable data links to the process control system 200.

The components of the process control system 200, e.g. the sampling model module 210 and the sampling plan module 220 may be realized in hardware, software, or a combination thereof. For example, at least one of the sampling model module 210 and the sampling plan module 220 may be or may include a processing unit that predominantly performs computer operations for carrying out the described functionality. According to other embodiments, at least one of the sampling model module 210 and the sampling plan module 220 is a computer capable of performing instructions stored on a non-transitory computer-readable medium.

The process control system 200 and the sub-systems therein can include a personal computer system, image computer, mainframe computer system, workstation, network appliance, internet appliance, or other device. The sub-system(s) or system(s) may also include any suitable processor known in the art, such as a parallel processor. In addition, the sub-system(s) or system(s) may include a platform with high speed processing and software, either as a standalone or a networked tool.

In some embodiments, various steps, functions, and/or operations of process control system 200 and the sub-systems therein and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor (or computer system) or, alternatively, multiple process (or multiple computer systems). Moreover, different sub-systems of the process control system 200 may include one or more computing or logic systems. Therefore, the above description should not be interpreted as a limitation on the present disclosure but merely an illustration.

Figure 2A:
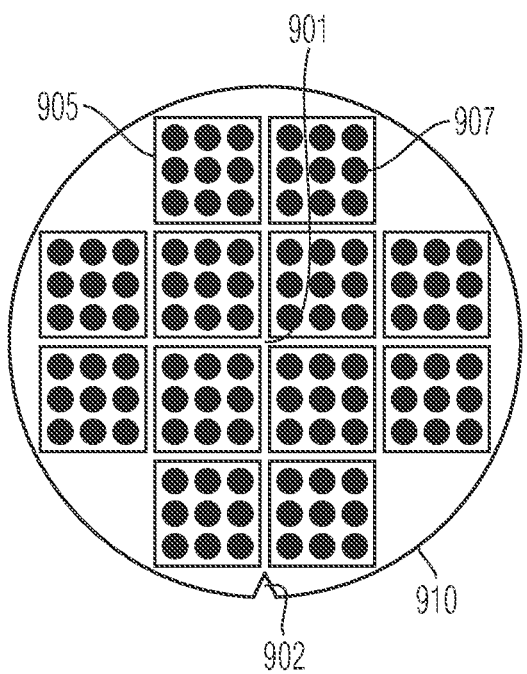
FIG. 2A illustrates an example of a wafer comprising exposure fields and sample points.

FIG. 2A illustrates an example of a wafer 910 comprising 12 exposure fields 905. FIG. 2A also shows a center point 901 and a notch 902 that may be useful for defining an arbitrary position on the wafer. FIG. 2A further illustrates an example of a sampling plan for a wafer 910, when a complete or dense sampling of the wafer 910 is performed. The dots 907 are sample points in the sampling plan. It is assumed for the sake of the following discussion that all sample points are arranged on a single wafer of a wafer lot 900. As is clearly to be understood, the plurality of sample points may as well be distributed among a plurality of wafers of a wafer lot 900. As is illustrated in FIG. 2A the sampling plan contains position information about a first number N (=9×12 in the example of FIG. 2A) of sample points 907 on wafer 910.

Measurement values at the first number N of sample points 907 are obtained. The measurement values refer to a first physical property of the wafer 910 and are measured by a first metrology tool. According to embodiments, the measurement values may be evaluated by the first metrology tool or by a system comprising the first metrology tool. According to further embodiments, the measurement values may be transmitted to a process control system which monitors and controls the process. For example, in case the measurement values are evaluated by the first metrology tool, obtaining the measurement values comprises performing the measurement of the first physical property by the first metrology tool.

Thereafter, the first number of measurement values are modelled using a wafer model to obtain a first set of coefficients according to a reference model 120. The wafer model is based on a model function that describes a quantifiable physical property as a function of one or more position variable(s). An example of this process is illustrated with reference to FIG. 2B.

Figure 2B:
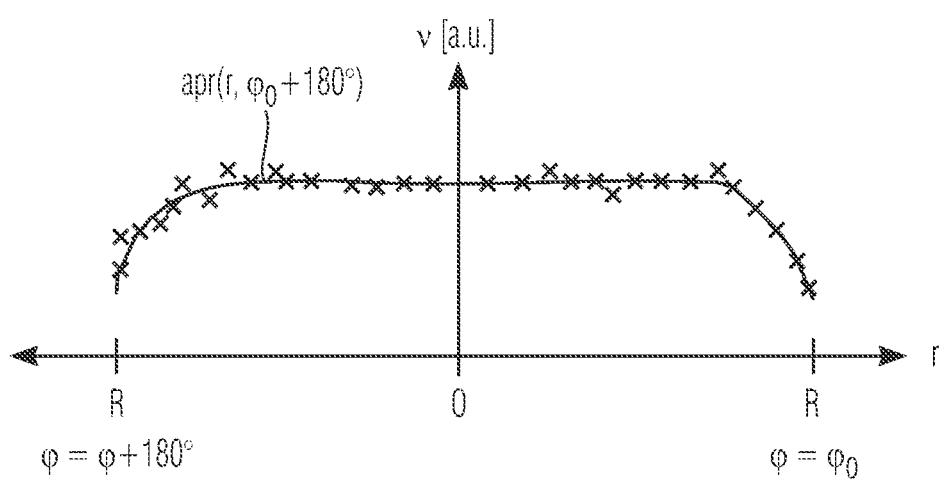
FIG. 2B illustrates modelling measurement values using a wafer model.

FIG. 2B shows the first number N of measurement values $v(r,\varphi)$ obtained from the wafer 910 with a radius R in a metrology tool at the first number N of sample points. The positions of the sample points may be defined by a distance r to the centre point 901 and an azimuthal angle $\varphi$ defined with respect to the wafer notch 902. The measurement values $v(r,\varphi)$ may represent levelling data with or without wafer bow, overlay data, CD-data or any other physical characteristic. The dashed line shows a point symmetric approximation function $apr(r)$ that may approximate the distribution of the measurement values $v(r,\varphi)$ in closed form, e.g., by using Legendre polynomials. Equation (1) may give the approximation function $apr(r)$ for the j-th process wafer:

$$apr_j(r) = \Sigma_{i=0}^{m} a_{i,j} r^i \quad (1)$$

For example, in case m is equal 0 and the measurement values $v(r,\varphi)$ are overlay data, $a_{0,j}$ represents a mean shift, e.g. in the x- or y-direction or a mean CD ("critical dimension") of structures of the j-th process wafer. The sampling model module may approximate the measurement values $v(r,\varphi)$ by minimizing an error function, e.g., an error function $\varepsilon(r,\varphi)$ as defined in equation (2):

$$\varepsilon(r,\varphi) = |v(r,\varphi) - apr(r)| \quad (2)$$

Then the sampling model module may determine the coefficients of one or more wafer model instances, e.g., the coefficients of a wafer model instance $vmw_{sj}(r)$ for a collection s of j process wafers. By way of example, the collection s may include all process wafers exposed at the same exposure position, e.g., on the same chuck in a lithography assembly including two or more chucks. According to another embodiment, the collection s may include some or all process wafers of the same wafer lot.

Calculation of the coefficients may be based on equation (3):

$$vmw_{sj}(r) = \Sigma_{i=0}^{m} b_{s,i,j} r^i \quad (3)$$

Methods of how to determine the coefficients are generally known and will not be described further.

Another embodiment uses, for each collection of process wafers, a model function $vmw_j(r\varphi)$ defined by at least two Zernike polynomials selected from $Z_n^m(r,\varphi)$ and $Z_n^{-m}(r,\varphi)$ as defined in equations (5a) and (5b), wherein m and n are non-negative integers:

$$Z_n^m(r,\varphi) = R_n^m(r)\cos(m\varphi) \quad (5a)$$

$$Z_n^{-m}(r,\varphi) = R_n^m(r)\sin(m\varphi) \quad (5b)$$

In equations (5a) and (5b) $\varphi$ is the azimuthal angle defined, e.g., with respect to a wafer notch, r is the distance to the centre point normalized to the wafer radius and $R_n^m$ are the radial polynomials as defined in equations (6a) and (6b):

$$R_n^m(r) = \sum_{k=0}^{\frac{n-m}{2}} \frac{(1)^k(n-k)!}{K!\left(\frac{n+m}{2}-k\right)!\left(\frac{n-m}{2}-k\right)!} r^{n-2k} \quad (6a)$$

for $|n-m| \bmod 2 = 0$ $$R_n^m = 0 \text{ for } |n-m| \bmod 2 = 1 \quad (6b)$$

The Zernike polynomials allow an angle-dependent adaptation of the wafer model instances such that the wafer model instances may include information on any process bias or on any systematic error resulting in a tip or tilt of the value of a physical property of the wafer along two orthogonal axes.

The coefficients, e.g., the radial polynomials of the Zernike polynomials descriptive for a current process wafer may be obtained by minimizing an error function as described in equation (7):

$$\varepsilon(r,\varphi) = |v(r,\varphi) - f(R_n^m(r)\cos(m\cdot\varphi), R_n^m(r)\sin(n\cdot\varphi)| \quad (7)$$

A wafer model instance $vmw_{sj}(r,\varphi)$ for a collection s of process wafers may contain at least some of the Zernike polynomials $Z_1^1$, $Z_1^{-1}$, $Z_1^{-2}$, $Z_2^2$, $Z_3^{-1}$, $Z_3^1$, and $Z_4^0$. According to an embodiment the wafer model instance $vmw_{sj}(r,\varphi)$ contains at least one Zernike polynomial centred to the centre point of the wafer model. According to a further embodiment the wafer model instance $vmw_{sj}(r,\varphi)$ contains at least two Zernike polynomials that indicate dependency on the azimuth angle cp. According to another embodiment the wafer model instance $vmw_{sj}(r,\varphi)$ contains at least the Zernike polynomials $Z_1^1$, $Z_1^{-1}$, $Z_2^0$, and $Z_4^0$.

In the following, a method of reducing the number of data points will be described while referring to FIGS. 3A to 3D.

Figure 3A:
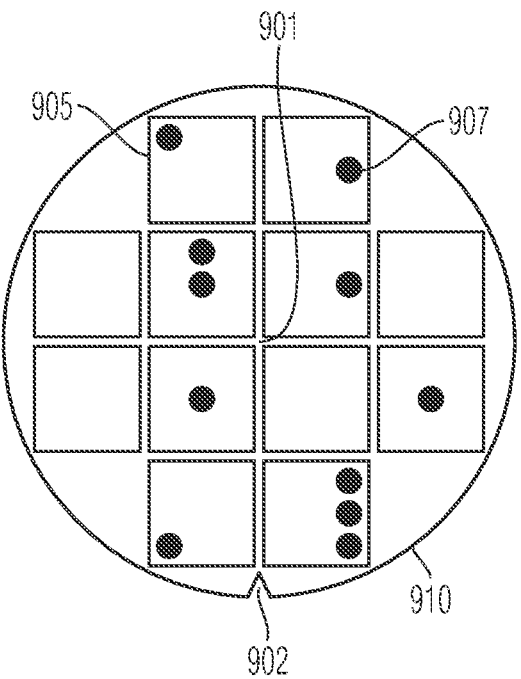
FIG. 3A illustrates an example of a wafer comprising exposure fields and a reduced number of sample points.

As shown in FIG. 3A, a second number M of sample points 907 are randomly selected from the first number N of sample points 907. The second number M is smaller than the first number N. For example, the second number M may be equal to or smaller than 0.5*N. According to further embodiments, M may be equal to or smaller than 0.3*N. In the example of FIG. 3A, M is equal to 11. The second number M are randomly selected from the first number N of sample points. Accordingly, there may be exposure fields 905 without sample points. Further, there may be exposure fields 905 in which sample points are accumulated.

Thereafter, the second number M of measurement values measured for the second number M of sample points 907 are modelled using the above explained wafer model to obtain a second set of coefficients according to a phase_1 model 140. The process that has been explained with reference to FIG. 2B is performed for the reduced number of measurement values.

In a next step, the deviation between the reference model 120 and the phase_1 model 140 may be calculated. For example, this may be accomplished using generally known methods. For example, this comparison may be performed by evaluating the models densely over the wafer, e.g. on a grid.

Figure 3B:
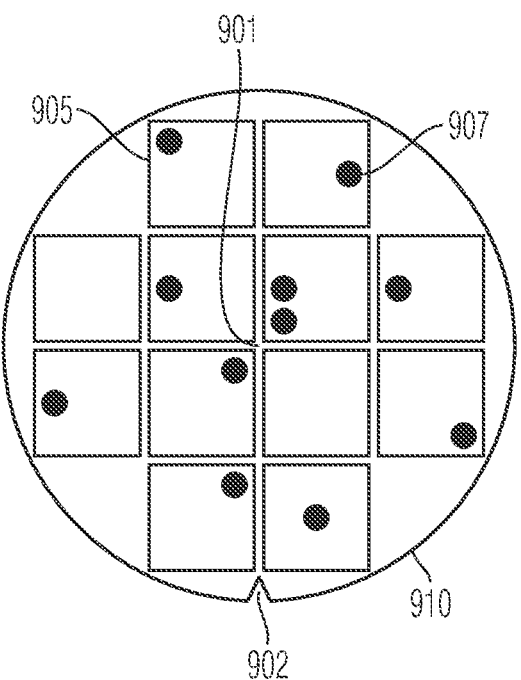
FIG. 3B illustrates an example of a wafer comprising exposure fields and a reduced number of sample points.

Thereafter, it may be determined whether sufficient iterations have been performed. According to embodiments, a second number M of sample points may be randomly selected several times until the deviation between the reference model 120 and the phase_1 model 140 is smaller than a predetermined value. According to further embodiments, these steps may also be performed for a predetermined times or a predetermined number of times or until the calculated deviation does not further decrease. As a result, a subsample is obtained. FIG. 3B shows an example of the subsample for the sake of following discussion.

Figure 3C:
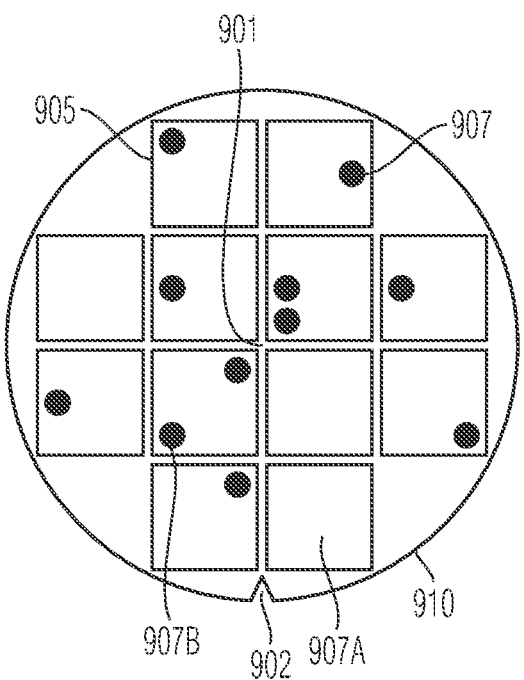
FIG. 3C illustrates an example of a wafer comprising exposure fields and a reduced number of sample points.

Thereafter, a kind of fine-tuning of the subsample or the reduced set of sample points 907 is performed. To this end, one of the sample points of the subsample is randomly replaced by one of the N-M sample points which are not included in the selected set of sample points 907. This is illustrated in FIG. 3C, in which sample point 907A that was a valid sample point in FIG. 3B, now is replaced by sample point 907B. As a result, a modified subsample is obtained.

Then, the second number M of sample points 907 of the modified subsample are modelled using the above explained wafer model to obtain a third set of coefficients according to a phase_2 model. The process that has been explained with reference to FIG. 2B is performed for the modified set of measurement values.

Thereafter, the deviation between the reference model 120 and the phase_2 model 160 is calculated. Again, this may be accomplished using generally known methods. Thereafter, similarly as has been discussed above, it may be determined whether sufficient iterations have been performed. According to embodiments, the above described random replacement may be performed several times until the deviation between the reference model 120 and the phase_2 model 160 is smaller than a predetermined value. According to further embodiments, these steps may also be performed for a predetermined time or for a predetermined number of times or until the calculated deviation does not further decrease. As a result a final subsample and a reduced sampling plan are obtained.

Thereafter, further measurements may be performed using the final subsample. According to embodiments, the final subsample may be used for measuring the same wafer (lot) in a different metrology tool, e.g. for determining a different measurement value. According to further embodiments, the final subsample may be used for measuring further wafer (lots) in the same metrology tool.

Figure 4:
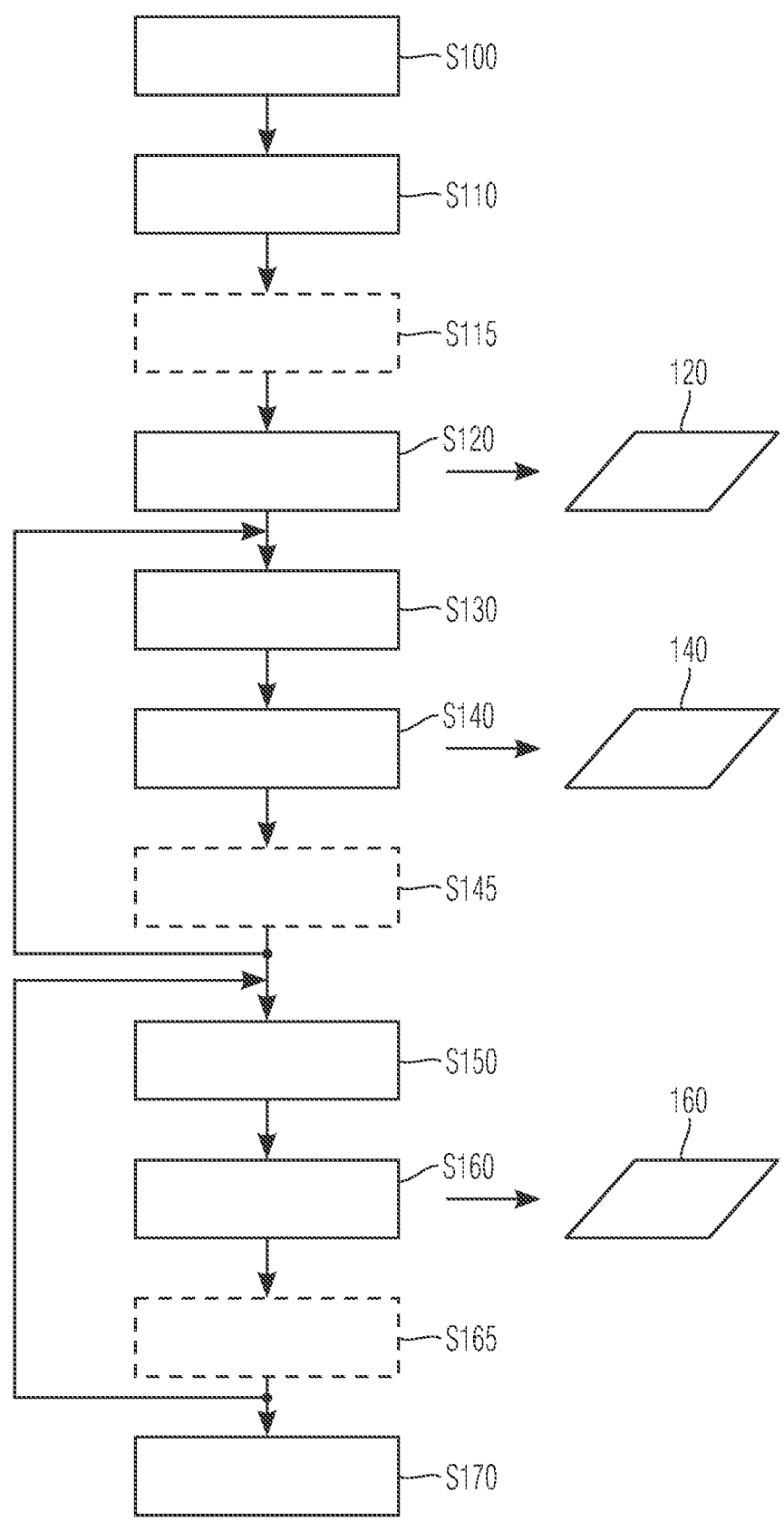
FIG. 4 summarizes a method according to embodiments.

FIG. 4 summarizes the method explained above. As has been discussed, a method of manufacturing semiconductor device comprises defining (S100) a sampling plan in a process control system, the sampling plan containing position information about a first number N of sample points on a process wafer, obtaining (S110) measurement values at the first number N of the sample points, the measurement values referring to a first physical property of the process wafer measured by a first metrology tool, and modelling (S120) the first number of measurement values using a wafer model to generate a first set of coefficients according to a reference model 120, the wafer model being based on a model function describing the physical property as a function of one or more position variable(s). The method further comprises randomly selecting (S130) a second number M of the first number N of sample points, wherein M<N, modelling (S140) the second number M of measurement values obtained at the second number M of sample points, using the wafer model to generate a second set of coefficients according to a phase_1 model, randomly replacing (S150) one of the M sample points by one of the N−M sample points to obtain a subsample, modelling (S160) the measurement values of the subsample using the wafer model to generate a third set of coefficients according to a phase_2 model, and using (S170) the subsample of sample points for performing further measurements.

The method may further comprise calculating (S145) a first deviation between the reference model 120 and the phase_1 model 140 and calculating (S165) a second deviation between the reference model 120 and the phase_2 model 160.

According to embodiments, randomly selecting (S130) the second number M of the first number N of sample points and modelling (S140) the second number M of measurement values using the wafer model to generate a second set of coefficients according to the phase_1 model 140 may be repeated until a predetermined number of random selections has been performed or a predetermined time has been lapsed.

According to further embodiments, randomly selecting (S130) the second number M of the first number N of sample points and modelling (S140) the second number M of measurement values using the wafer model to generate a second set of coefficients according to the phase_1 model 140 may be repeated until the first deviation is below a predetermined threshold value.

According to still further embodiments, randomly selecting (S130) the second number M of the first number N of sample points and modelling (S140) the second number M of measurement values using the wafer model to generate a second set of coefficients according to the phase_1 model 140 may be repeated until the first deviation does not further decrease.

According to embodiments, randomly replacing (S150) one of the M sample points by one of the N−M sample points to obtain a subsample and modelling (S160) the measurement values of the subsample using the wafer model to generate a third set of coefficients according to a phase_2 model 160 may be repeated until a predetermined number of random replacements has been performed or a predetermined time has been lapsed.

According to further embodiments, randomly replacing (S150) one of the M sample points by one of the N−M sample points to obtain a subsample and modelling (S160) the measurement values of the subsample using the wafer model to generate a third set of coefficients according to a phase_2 model 160 may be repeated until the second deviation does not further decrease.

In the method explained above, M may be smaller than 0.9*N or even smaller than 0.5*N. For example, M may be larger than 0.1*N, e.g. larger than 0.2*N.

According to embodiments, the method may further comprise reducing (S115) the number of N measurement values before modelling (S120) the first number of measurement values or before randomly selecting (S130) the second number M of the first number N of sample points.

As has been explained above, phase_1 randomly selects a subset of sample positions to find a "rough" estimate of best sample. Then, phase_2 only switches the state of single sample positions for a "finer" search.

The wafer model chosen may be any suitable model. Although a wafer model using Legendre polynomials or Zernike polynomials has been described with respect to FIG. 2B, any other model comprising, e.g. standard polynomial models and any of the models discussed in the following may be used.

According to embodiments, the function of the measurement values in dependence from position coordinates may be interpolated or triangulated. Accordingly, the wafer model may be an interpolation model. For example, this may be accomplished using linear interpolation, interpolation using higher polynomials, natural interpolation, spline modelling such as e.g. polyharmonic spline modelling, RBF ("radial basis function") interpolation, trigonometric interpolation and others. When using interpolation as the wafer model, the dense data, i.e. the measurement values of the initial sampling plan, and the sparse data, i.e. the measurement values of the reduced sampling plan, are correspondingly interpolated, evaluated on a grid and compared. For example, using an interpolation method, the signature (i.e. the measurement values in dependence of the position of the sample points) of the wafer may be represented more exactly than it is the case using a polynomial wafer model.

Optionally, a filtering step may be performed before performing the interpolation to reduce noise or flyers. For example, the filtering may comprise a Fast Fourier Transformation on the raw data. Further, a smoothing filter such as Savitzky-Golay-Filter or Gaussian Filter may be applied to gridded data.

According to further embodiments, the data may be reduced before performing the above-described method, for example, before modelling the first number of measurement values or before randomly selecting a second number M of the first number N of sample points. To be more specific, less significant measurement values may be deleted. According to embodiments, the less significant measurement values may be deleted using a triangulation method. For example, the input for the triangulation method may be a mesh generated by Delauney triangulation based on the raw data, e.g. the measurements values at the first number N of the sample points. This mesh may be reduced by techniques that are known from 3D graphics, for example. As a result, the mesh vertices may be reduced while keeping the surface geometry as closely to the original mesh. One example is Coplanar facets merging, where facets with a similar normal vector may be merged to a single facet. Other methods are re-tiling, energy function optimization, or vertex clustering. According to further embodiments, a pre-filtering step may be performed before performing triangulation.

According to further embodiments, before performing the above-described method, for example, before modelling the first number of measurement values or before randomly selecting a second number M of the first number N of sample points, the data can also be reduced using a PCA ("Principal Components Analysis") method. Performing this method comprises a determination of the principal components (or clusters of signatures). The most important principal components (or clusters) will then be used for modelling the first number of measurement values, for example.

The method has been explained with respect to sample points on a single process wafer. As is clearly to be understood, the sample points may also be distributed over several wafers, e.g. belonging to a single wafer lot or belonging to different lots. As a result, the number of sample points per single wafer may be further decreased. For example, in such a case, the set of wafers may yield a "combined" sample point set that allows reproduction of the full wafer signature. In addition, the sample points may be taken at different timings.

According to further embodiments, the above process may be performed multiple times using different selections of the second number M of sample points. As a result different sampling plans may be generated. From a plurality of sampling plans, for example, an "importance" may be assessed for each sample point or mark. Using this information, the sample points may be ranked and distributed over many sampling plans ("dynamic sampling") that may finally result in a more complete point set over time. Using multiple sampling optimization runs over time it is possible to increase the stability.

According to further embodiments several choices of the first number N of sample points on the process wafer may be used. For example, the positions of the N sample points may be varied. Measurement values may be obtained at the first number N of the sample points. Thereafter, as has been explained above, randomly selecting a second number M of the first number N of sample points, wherein M<N, may be performed. Again, different selections of M may be taken. As a result, the positions of the N sample points may be varied and, optionally, further, the selection of M may be varied. By these procedures the stability of the process may be checked. Further, the importance of the marks may be checked.

According to further embodiments, different choices of the first number N of sample points on the process wafer may be used. Further, different selections of M may be taken. Then, the user or an operator of the processing tool may select an appropriate set of sample points.

As is clearly to be understood, the different models and methods described above may be combined as needed.

Using the method described above, it is possible to decrease the number of sample points. In particular, a second number M sample points of the first number N of sample points are randomly selected. As a result, the number of sample points may be remarkably reduced in comparison to methods in which the number of sample points is stepwise decreased, e.g. to N−1, N−2 etc. With M being less than $0.9*N$ or even less than $0.5*N$, the number of sample points is largely decreased. As a result, measurement time may be saved. For example, the method described above enables an accurate representation of the wafer pattern with as less sample points as possible. Hence, the accuracy of the sampling may be improved.

The method described herein may be performed without being bound to a specific wafer model. Hence, the method may be performed without the necessity to choose a model for optimization. For example, modelling the measurement values may be performed using interpolation or triangulation. As a result, the method may be further automatized. Further, if the signature changes over time, it is not necessary to perform an update of the polynomial model chosen. In particular, if an interpolation model is chosen as the wafer model, the topography of the measurement values may be modelled more exactly. As a result, the accuracy of the method is increased. If the PCA is also performed, a reduced sampling plan will be allowed that focuses on points of high variability. As a result, a further stability of the model may be achieved.

As has been described, the method described may use different wafer models. Accordingly, it is possible to use interpolation models or triangulation or PCA of the data. The sampling may be automatically updated.

The method described enables that characteristics of the signature (e.g. steep gradients) may be maintained when reducing the sampling. For example, this may be accomplished using the triangulation-based sampling.

Due to the reduced measurement time, it becomes possible to use the described method more frequently. Further, the whole method may be automatically performed and the sampling may be dynamically updated. By using the sampling optimization frequently, the weights of the marks or sample points may be assessed. This weights or "importances" may be used for more efficient dynamic sampling over time. For example, a certain ratio, e.g. 50% of the sampling may be held constant using the most "important" marks or sample points. The other marks may be sampled dynamically based on the ranking coming from the method described above.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A method of manufacturing a semiconductor device, the method comprising:
    defining a sampling plan in a process control system, the sampling plan containing position information about a first number N of sample points on a process wafer;
    obtaining measurement values at the first number N of the sample points, the measurement values referring to a first physical property of the process wafer measured by a first metrology tool;
    modelling the first number of the measurement values using a wafer model to generate a first set of coefficients according to a reference model, the wafer model being based on a model function describing the first physical property as a function of one or more position variables;
    randomly selecting a second number M of the first number N of the sample points, wherein M<N;
    modelling the second number M of the measurement values obtained at the second number M of sample points using the wafer model to generate a second set of coefficients according to a phase_1 model;
    randomly replacing one of the second number M of sample points by one of N−M sample points to obtain a subsample;
    modelling the measurement values of the subsample using the wafer model to generate a third set of coefficients according to a phase_2 model; and
    using the subsample of sample points for performing further measurements.

2. The method according to claim 1, further comprising calculating a first deviation between the reference model and the phase_1 model and calculating a second deviation between the reference model and the phase_2 model.

3. The method according to claim 1, wherein randomly selecting the second number M of the first number N of the sample points and modelling the second number M of the measurement values using the wafer model to generate the second set of coefficients according to the phase_1 model is repeated until a predetermined number of random selections has been performed or a predetermined time has lapsed.

4. The method according to claim 2, wherein randomly selecting the second number M of the first number N of the sample points and modelling the second number M of the measurement values using the wafer model to generate the second set of coefficients according to the phase_1 model is repeated until the first deviation is below a predetermined threshold value.

5. The method according to claim 2, wherein randomly selecting the second number M of the first number N of the sample points and modelling the second number M of the measurement values using the wafer model to generate the second set of coefficients according to the phase_1 model is repeated until the first deviation does not further decrease.

6. The method according to claim 1, wherein randomly replacing one of the second number M of the sample points by one of the N−M sample points to obtain the subsample and modelling the measurement values of the subsample using the wafer model to generate the third set of coefficients according to a phase_2 model is repeated until a predetermined number of random replacements has been performed or a predetermined time has been lapsed.

7. The method according to claim 2, wherein randomly replacing one of the second number M of the sample points by one of the N−M sample points to obtain the subsample and modelling the measurement values of the subsample using the wafer model to generate the third set of coefficients according to a phase_2 model is repeated until the second deviation does not further decrease.

8. The method according to claim 1, wherein M<0.9*N.

9. The method according to claim 8, wherein M<0.5*N.

10. The method according to claim 1, further comprising reducing the number of N measurement values before modelling the first number of measurement values or before randomly selecting the second number M of the first number N of the sample points.

11. The method according to claim 1, wherein the measurement values are levelling data representing height maps of the process wafer in a chucked state.

12. The method according to claim 1, wherein the measurement values refer to a critical dimension or an overlay.

13. The method according to claim 1, wherein the wafer model comprises Legendre polynomials.

14. The method according to claim 1, wherein the wafer model comprises Zernike polynomials.

15. The method according to claim 1, wherein the wafer model comprises an interpolation model.

16. The method according to claim 1, wherein the further measurements relate to a second physical property and the further measurements are performed using a second metrology tool.

17. The method according to claim 1, wherein the further measurements relate to different process wafers.

18. A non-transitory computer-readable storage medium comprising a computer program with instructions which, when the program is executed by a computer, cause the computer to carry out the method of claim 1.

19. A process control system for a semiconductor manufacturing assembly, the process control system being configured to
    define a sampling plan in a process control system, the sampling plan containing position information about a first number N of sample points on a process wafer;
    obtain measurement values at the first number N of the sample points, the measurement values referring to a first physical property of the process wafer measured by a first metrology tool;
    model the first number of the measurement values using a wafer model to generate a first set of coefficients according to a reference model, the wafer model being based on a model function describing the first physical property as a function of one or more position variables;

randomly select a second number M of the first number N of the sample points, wherein M<N;

model the second number M of the measurement values obtained at the second number M of the sample points using the wafer model to generate a second set of coefficients according to a phase_1 model;

randomly replace one of the second number M of the sample points by one of N–M sample points to obtain a subsample;

model the measurement values of the subsample using the wafer model to generate a third set of coefficients according to a phase_2 model; and provide the subsample of sample points as a reduced sampling plan for performing further measurements.

* * * * *